(12) United States Patent
Tung

(10) Patent No.: US 6,222,247 B1
(45) Date of Patent: Apr. 24, 2001

(54) SEMICONDUCTOR RESISTOR THAT CAN BE WITHSTAND HIGH VOLTAGES

(75) Inventor: Ming-Tsung Tung, Hsin-Chu (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 09/452,107

(22) Filed: Dec. 2, 1999

(51) Int. Cl.[7] ............................. H01L 29/00; H01L 29/76; H01L 29/94

(52) U.S. Cl. ............................. 257/536; 257/379; 257/528; 257/533

(58) Field of Search .................................. 257/379, 528, 257/533, 536

(56) References Cited

U.S. PATENT DOCUMENTS 4,511,789 * 4/1985 Goessler et al. .
4,721,985 * 1/1988 Pavlidis et al. .
4,792,840 * 12/1988 Nadd .
5,053,743 * 10/1991 Mille et al. .

* cited by examiner

Primary Examiner—Stephen D. Meier
(74) Attorney, Agent, or Firm—Winston Hsu

(57) ABSTRACT

A high-voltage resistor comprises a silicon substrate, a first doped layer in a strip-like area approximately spiral in shape within a predetermined area on the substrate, a plurality of second doped layers formed along the strip-like area of the first doped layer, a trench formed in the substrate and adjacent to the strip-like area of the first doped layer, a first dielectric layer formed on the surface of the first doped layer, the second doped layers and the trench, a second dielectric layer formed on the surface of the first dielectric layer within the trench and filling the trench, and a passivation layer formed on the first dielectric layer and the second dielectric layer. The silicon substrate is doped with first-type dopants, the first-type can be either n-type or p-type. The first doped layer is formed of second-type dopants, the second-type can be either n-type or p-type and different from the first-type. A plurality of second doped layers is formed by ion implantation along the strip-like area of the first doped layer, the dopant density of the second doped layers being larger than that of the first doped layer.

11 Claims, 4 Drawing Sheets

SEMICONDUCTOR RESISTOR THAT CAN BE WITHSTAND HIGH VOLTAGES

BACKGROUND OF THE INVENTION

1. Field of the Invention

The present invention relates to a resistor positioned on a semiconductor wafer, and more particularly, to a semiconductor resistor for withstanding high voltages.

2. Description of the Prior Art

Resistors used in high voltage circuits, such as radio frequency integrated circuits (RFIC), microwave frequency integrated circuits or high power integrated circuits, are typically formed in a rectangular-shaped spiral and have a large surface area. This enables them to withstand high voltages.

Please refer to FIG. 1 to FIG. 3. FIG. 1 is a top view diagram of a first doped layer 14 and a second doped layer 16 of a prior art semiconductor resistor 10 for withstanding high voltages. FIG. 2 is a cross-sectional diagram along line 2—2 of the semiconductor resistor 10 shown in FIG. 1. FIG. 3 is a cross-sectional diagram of the prior art semiconductor resistor 10. The prior art semiconductor resistor 10 for withstanding high voltages is formed on an n-type silicon substrate 12 of a semiconductor wafer. The semiconductor resistor 10 comprises a first doped layer 14 that functions as a resistor for withstanding high voltages in a predetermined area on the silicon substrate 12, a second doped layer 16 formed in a predetermined area of the first doped layer 14; a dielectric layer 18 positioned on the surface of the silicon substrate 12, the first doped layer 14 and the second doped layer 16; and a passivation 20 layer positioned on the dielectric layer 18. The first doped layer 14 is p-type and the second doped layer 16 is n-type. The junction of the first doped layer 14 and silicon substrate 12 forms a pn-junction to prevent electrical leakage.

The resistor 10 is made by implanting ions in a predetermined area on the silicon substrate 12 to form the p-type doped layer 14, as shown in FIG. 2. The first doped layer 14 is formed in a strip-like area that is shaped approximately like a square wave within the predetermined area. The second doped layer 16, that is similar to the first doped layer 14 in shape, is formed by implanting ions in a predetermined area within the first doped layer 14.

The dielectric layer 18 is then deposited on to the silicon substrate 12, the first doped layer and the second doped layer. Contact windows (not shown) are formed at the two ends of the resistor by lithography and etching. Contact windows are used to connect the resistor 10 with other devices on the semiconductor wafer. Finally, the passivation layer 20 is deposited on the surface of the resistor 10 to complete the resistor 10.

With the deposition of the passivation layer 20, some charged ions are mixed with the depositing particles, and a plurality of charges at fixed positions are generated. An electric field is generated by this charge in the passivation layer 20 when the resistor 10 is connected. This reduces the breakdown voltage of the pn-junction of the silicon substrate 12 and the doped layer 14 and generates electrical leakage. Since the doped layer 14 is formed on the silicon substrate 12 in a strip-like area that is shaped approximately like a square wave, it forms right-angled corners. When the resistor is used at high voltages, a strong electric field is generated at the right-angled corners of the doped layer. This reduces the voltage value of the resistor 10.

SUMMARY OF THE INVENTION

It is therefore a primary objective of the present invention to provide a resistor for withstanding high voltages; the resistor can prevent electrical leakage and the reduction of the breakdown voltage caused by electric fields induced by fixed charges in the passivation layer.

In a preferred embodiment, the present invention provides a semiconductor resistor formed in a predetermined area on the surface of a semiconductor wafer, the semiconductor wafer comprising a silicon substrate doped with first-type dopants, the first-type being either n-type or p-type, the resistor comprising:

a first doped layer in a strip-like area approximately spiral in shape within the predetermined area, the first doped layer formed by ion implantation of second-type dopants and serving as a resistor, the second-type being either n-type or p-type and different from the first-type;

a plurality of second doped layers formed by ion implantation along the strip-like area of the first doped layer, the dopant density of the second doped layers being larger than that of the first doped layer;

a trench formed in the substrate and adjacent to the strip-like area of the first doped layer, the depth of the trench being less than that of the first doped layer;

a first dielectric layer formed on the surface of the first doped layer, the second doped layers and the trench;

a second dielectric layer formed on the surface of the first dielectric layer within the trench and filling the trench; and a passivation layer formed on the first dielectric layer and the second dielectric layer.

It is an advantage of the present invention that the resistor for withstanding high voltages can prevent electrical leakage and avoids the reduction of the breakdown voltage caused by electric fields induced by fixed charges in the passivation layer.

These and other objectives of the present invention will no doubt become obvious to those of ordinary skill in the art after having read the following detailed description of the preferred embodiment that is illustrated in the various figures and drawings.

DETAILED DESCRIPTION OF THE PREFERRED EMBODIMENT

Figure 1:
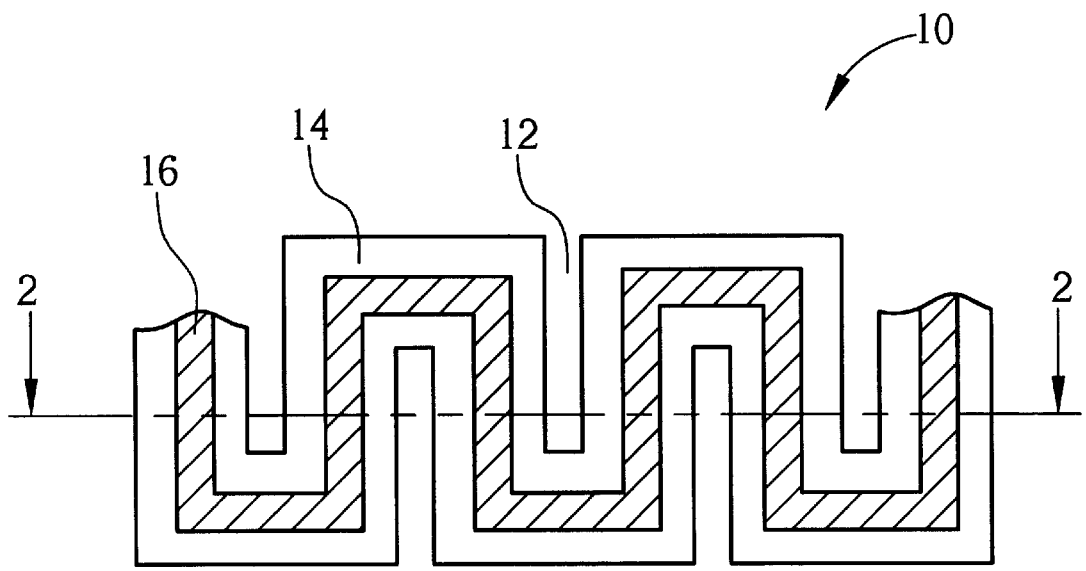
FIG. 1 is a top view diagram of a first doped layer and a second doped layer of a prior art semiconductor resistor for withstanding high voltages.
Figure 2:
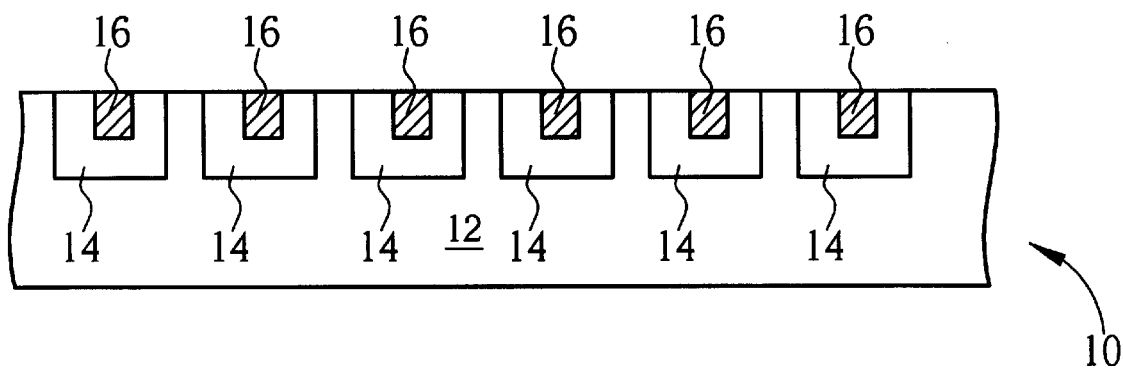
FIG. 2 is a cross-sectional diagram along line 2—2 of the semiconductor resistor shown in FIG. 1.
Figure 3:
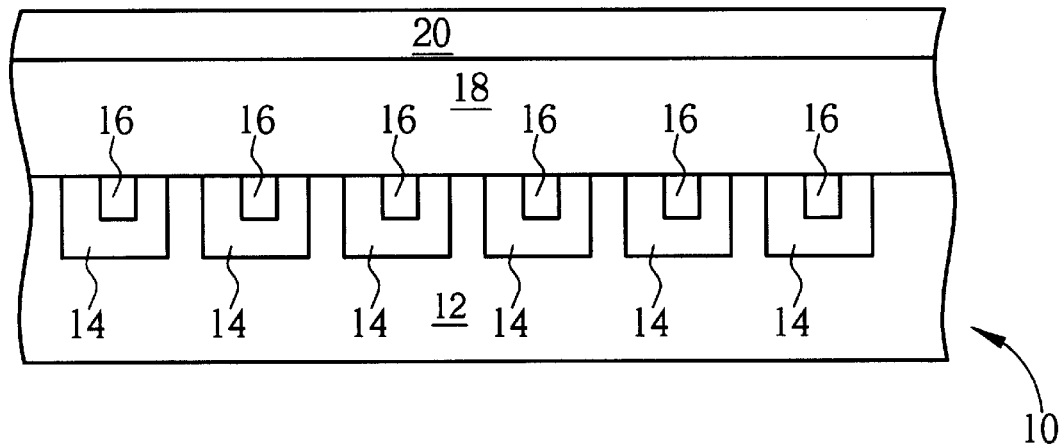
FIG. 3 is a cross-sectional diagram of a prior art semiconductor resistor.
Figure 4:
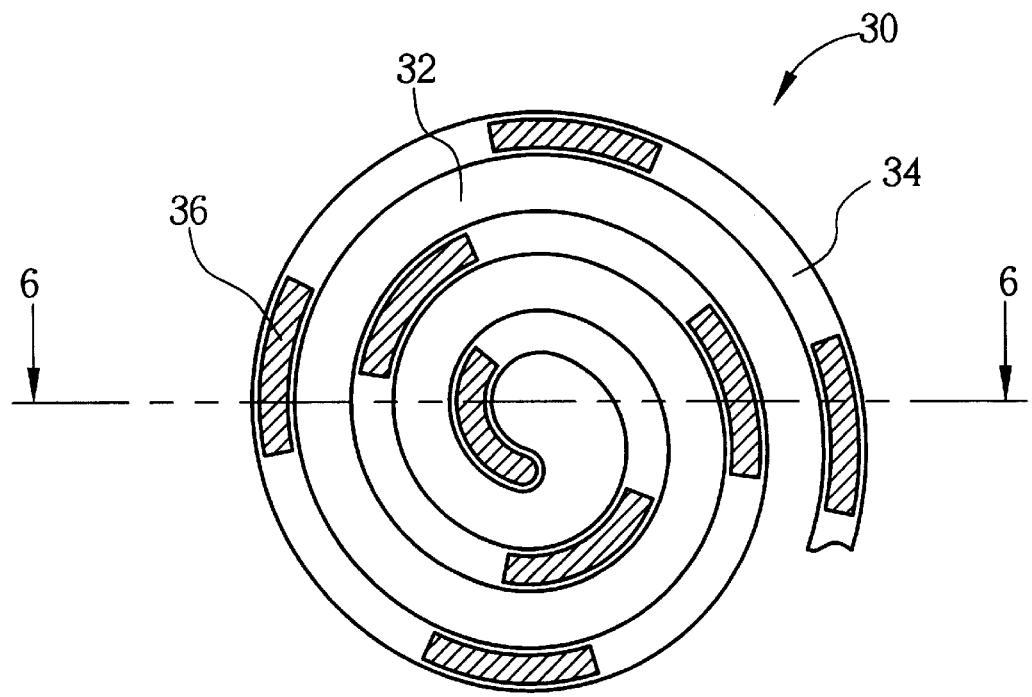
FIG. 4 is a top view diagram of a first doped layer and a second doped layer of the present invention semiconductor resistor for withstanding high voltages.
Figure 5:
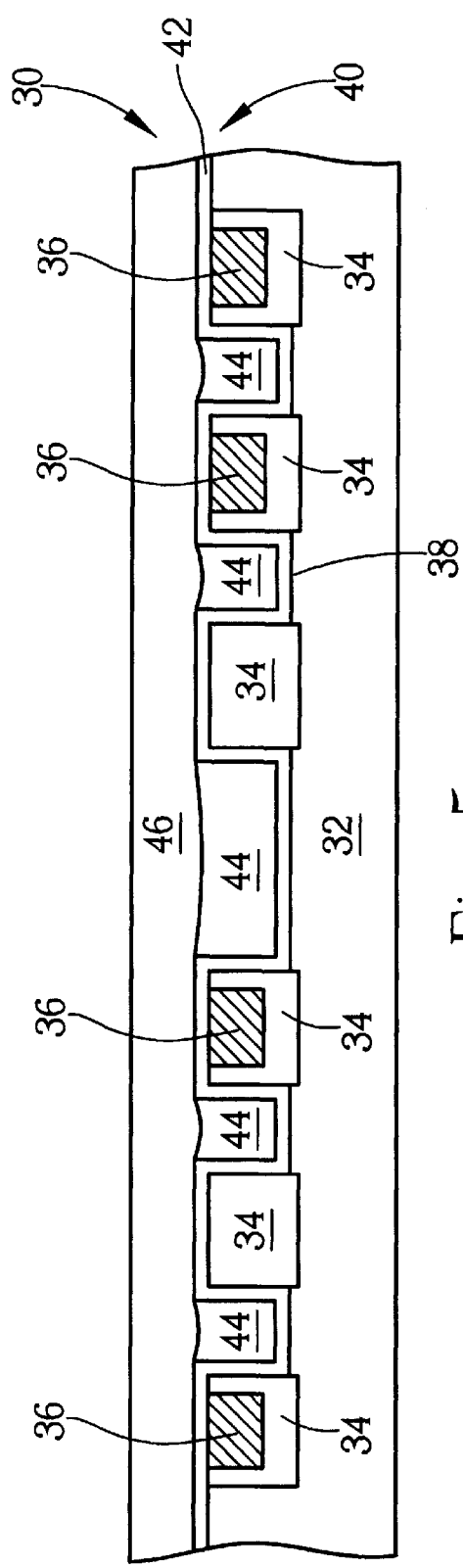
FIG. 5 is a cross-sectional diagram of the present invention semiconductor resistor.

Please refer to FIG. 4 and FIG. 5. FIG. 4 is a top view diagram of first and second doped layers, 34 and 36 respectively, of a present invention semiconductor resistor 30 for withstanding high voltages. The present invention resistor 30 is formed in a predetermined area on a semiconductor wafer. The semiconductor wafer comprises a silicon substrate 32 doped with first-type dopants that are either n-type or p-type. The resistor 30 comprises the first doped layer 34 in a strip-like area approximately spiral in shape within the predetermined area, a plurality of second doped layers 36 formed along the strip-like area of the first doped layer 34, a trench 38 adjacent to the strip-like area of the first doped layer 34 in which the depth of the trench 38 is less than that of the first doped layer 34; a dielectric layer 40 positioned on the surface of the first doped layer 34, the second doped layers 36 and the trench 38; and a passivation layer 46 positioned on the dielectric layer 40. The dielectric layer 40 comprises a first dielectric layer 42 formed on the surface of the first doped layer 34, the second doped layers 36 and the trench 38, and a second dielectric layer 44 formed on the surface of the first dielectric layer 42 within the trench 38 and filling the trench 38. The first doped layer 34 is formed of second-type dopants and serves as a resistor, and the second-type is either n-type or p-type and different from the first-type.

Figure 6:
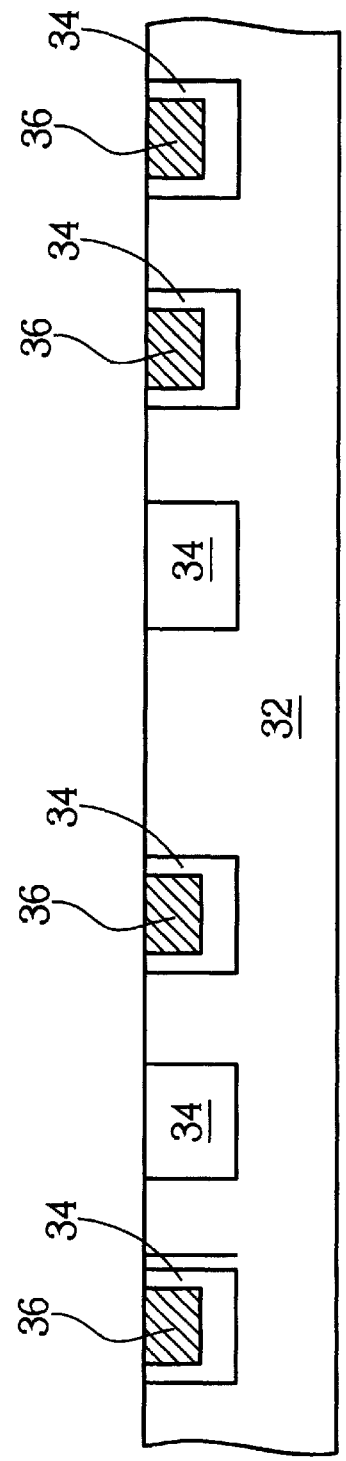
FIG. 6 is a cross-sectional diagram along line 6—6 of the semiconductor resistor shown in FIG. 4.

Please refer to FIG. 6. FIG. 6 is a cross-sectional diagram along line 6—6 of the semiconductor resistor shown in FIG. 4. The resistor 30 is produced by first implanting ions in a predetermined area on the silicon substrate 32 to form the first doped layer 34. This layer functions as a resistor. Then, ions are implanted into predetermined areas in the first doped layer 34 to form a plurality of second doped layers 36 in which the dopant density of the second doped layers 36 is larger than that of the first doped layer 34. The first doped layer 34 is formed in a strip-like area approximately spiral in shape within the predetermined area on the silicon substrate 32. The second doped layers 36 are spaced with a predetermined distance in the first doped area 34 and are used for adjusting the resistance of the resistor 30 to avoid dramatic voltage drops along the first doped layer 34.

Figure 7:
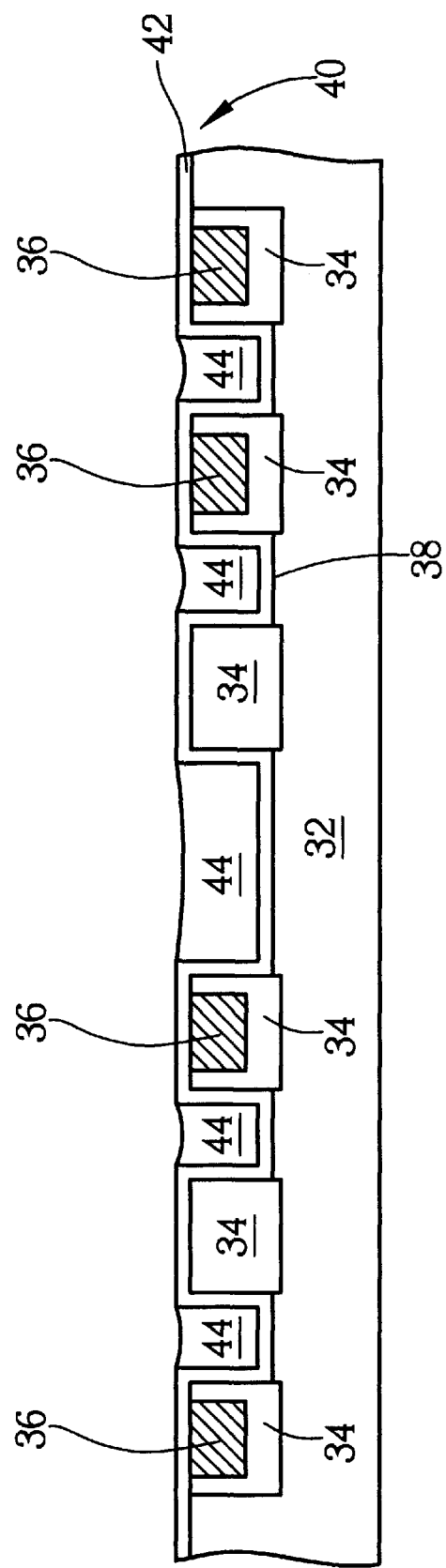
FIG. 7 is a cross-sectional diagram of forming a trench on the present invention semiconductor resistor.

Please refer to FIG. 7. FIG. 7 is a cross-sectional diagram of forming the trench 38 on the semiconductor resistor 30. After the first doped layer 34 and the second doped layers 36 are completed, a trench is formed in the silicon substrate 32 adjacent to the strip-like area of the first doped layer. Lithographic and etching processes are used to form the trench 38. The depth of the trench 38 is less than that of the first doped layer 34. The first dielectric layer 42 is then deposited on the surface of the first doped layer 34, the second doped layers 36 and the trench 38. The second dielectric layer 44, made of spin-on-glass, is deposited on the surface of the first dielectric layer 42, filling the trench 38. The second dielectric layer 44 on the first doped layer 34 and the second doped layers 36 is removed to form the isolating trench 38. An etching back process is used to remove the unwanted portions of the dielectric layer 44.

Finally, the passivation layer 46 of silicon nitride is formed on the surface of the resistor 30, as shown in FIG. 5. Contact windows (not shown) are formed at the two ends of the resistor 30 using photolithography and etching. The resistor 30 connects with other devices on the semiconductor chip through contact plugs that penetrate the first dielectric layer 42 and the passivation layer 46.

With the deposition of the passivation layer 46, some charged ions are mixed with the deposition particles, resulting in a plurality of charges at fixed locations within the passivation layer 46. An electric field is generated by this charge in the passivation layer 46 when the resistor 10 is connected. This reduces the breakdown voltage of the pn-junction of the silicon substrate 32 and the doped layers 34, 36 and generates electrical leakage. Because the trench 30 is adjacent to the strip-like area of the first doped layer 34 and is filled with the dielectric layer 40 in the substrate 32, the increased distance between the substrate 32 and the passivation layer 46 decreases the induced charge in the substrate 32. Hence, the resistor 30 of the present invention prevents both the reduction of breakdown voltage and electric leakage due to induced charge generated by the fixed charge in the passivation layer 46.

Moreover, charge in the substrate 32 is induced at the interface between the substrate 32 and the first dielectric layer 42. Charge in the first doped layer 34 and the second doped layers 36 are induced at the interface between the first dielectric layer 42 and the doped layers 34 and 36. The trench 38 separates the substrate 32 from the doped layers 34 and 36. The trench 38 prevents electric leakage of the resistor 30 from reducing the breakdown voltage at the interface between the pn-junction and the substrate 32. Because the first doped layer 34 is formed in a strip-like area approximately spiral in shape within the predetermined area on the substrate 32, the arc shaped periphery of the spiral shaped strip equilibrates the breakdown voltages between the pn-junction and the surface of the substrate 32.

In the resistor 30, the silicon substrate 32 is doped with first-type dopants that can be either n-type or p-type, and the first doped layer 34 is doped with second-type dopants that can be either n-type or p-type but which are different from the first-type. A pn-junction is formed at the interface between the first doped layer 34 and the substrate 32 to prevent electrical leakage. The second doped layers 36 can be either doped with first-type or second-type dopants, the doping density of the second doped layers 36 being greater than the first doped layer 34. First-type dopants are used in the second doped layers 36 for increasing the resistance of the resistor by reducing the cross-sectional area of the first doped layer 34. Second-type dopants are used in the second doped layers 36 for adjusting the resistance of the resistor to avoid dramatic voltage drops along the first doped layer 34.

In contrast to the prior art resistor 10, the resistor 30 comprises the first doped layer 34 formed in a strip-like area approximately spiral in shape, the arc shaped periphery of the spiral shaped strip equilibrating the breakdown voltage between the pn-junction and the surface of the substrate 32. Moreover, the resistor 30 comprises a trench 38 formed in the substrate 30 and adjacent to the strip-like area of the first doped layer 34. The trench 38 prevents electric leakage of the resistor 30 from reducing the breakdown voltage at the interface between the pn-junction and the substrate 32 by decreasing the induced charge generated by the fixed charge in the passivation layer 46.

Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A semiconductor resistor formed in a predetermined area on the surface of a semiconductor wafer, the semiconductor wafer comprising a silicon substrate doped with first-type dopants, the first-type being either n-type or p-type, the resistor comprising:

a first doped layer in a strip-like area approximately spiral in shape within the predetermined area, the first doped layer formed by ion implantation of second-type dopants and serving as a resistor, the second-type being either n-type or p-type and different from the first-type;

a plurality of second doped layers formed by ion implantation along the strip-like area of the first doped layer, the dopant density of the second doped layers being larger than that of the first doped layer;

a trench formed in the substrate and adjacent to the strip-like area of the first doped layer, the depth of the trench being less than that of the first doped layer;

a first dielectric layer formed on the surface of the first doped layer, the second doped layers and the trench;

a second dielectric layer formed on the surface of the first dielectric layer within the trench and filling the trench; and a passivation layer formed on the first dielectric layer and the second dielectric layer.

2. The resistor of claim 1 wherein the second doped layers are doped with dopants of the first-type and are used for increasing the resistance of the resistor by reducing the cross-sectional area of the first doped layer.

3. The resistor of claim 1 wherein the second doped layers are doped with dopants of the second-type and are used for adjusting the resistance of the resistor to avoid dramatic voltage drops along the first doped layer.

4. The resistor of claim 1 wherein the first dielectric layer is made of silicon oxide.

5. The resistor of claim 1 wherein the second dielectric layer is made of spin-on-glass (SOG).

6. A semiconductor resistor formed in a predetermined area on the surface of a semiconductor wafer, the semiconductor wafer comprising a silicon substrate doped with first-type dopants, the first-type being either n-type or p-type, the resistor comprising:

a first doped layer in a strip-like area approximately spiral in shape within the predetermined area, the first doped layer formed by ion implantation of second-type dopants and serving as a resistor, the second-type being either n-type or p-type and different from the first-type;

a plurality of second doped layers formed by ion implantation in a plurality of predetermined areas along the strip-like shape of the first doped layer, the second doped layers used for reducing the cross-sectional area of the first doped layer so as to increase the resistance of the resistor, the second doped layers being doped with dopants of the first-type, the dopant density of the second doped layers being larger than that of the first doped layer;

a trench formed in the substrate and adjacent to the strip-like area of the first doped layer, the depth of the trench being less than that of the first doped layer;

a first dielectric layer installed on the surface of the first doped layer, the second doped layers and the trench;

a second dielectric layer installed on the surface of the first dielectric layer within the trench and filling the trench; and a passivation layer installed on the first dielectric layer and the second dielectric layer.

7. The resistor of claim 6 wherein the first dielectric layer is made of silicon oxide.

8. The resistor of claim 6 wherein the second dielectric layer is made of spin-on-glass (SOG).

9. A semiconductor resistor formed in a predetermined area on the surface of a semiconductor wafer, the semiconductor wafer comprising a silicon substrate doped with first-type dopants, the first-type being either n-type or p-type, the resistor comprising:

a first doped layer in a strip-like area approximately spiral in shape within the predetermined area, the first doped layer formed by ion implantation of second-type dopants and serving as a resistor, the second-type being either n-type or p-type and different from the first-type;

a plurality of second doped layers formed by ion implantation in a plurality of predetermined areas along the first doped layer, the second doped layers used for avoiding dramatic voltage drops along the first doped layer, the second doped layers being doped with dopants of the second-type, the dopant density of the second doped layers being larger than that of the first doped layer;

a trench formed in the substrate and adjacent to the strip-like area of the first doped layer, the depth of the trench being less than that of the first doped layer;

a first dielectric layer installed on the surface of the first doped layer, the second doped layers and the trench;

a second dielectric layer installed on the surface of the first dielectric layer within the trench and filling the trench; and a passivation layer installed on the first dielectric layer and the second dielectric layer.

10. The resistor of claim 9 wherein the first dielectric layer is made of silicon oxide.

11. The resistor of claim 9 wherein the second dielectric layer is made of spin-on-glass (SOG).

* * * * *